(12) United States Patent
Hatakenaka

(10) Patent No.: US 11,107,677 B2
(45) Date of Patent: Aug. 31, 2021

(54) METHOD FOR MANUFACTURING SIC EPITAXIAL SUBSTRATE

(71) Applicant: Mitsubishi Electric Corporation, Tokyo (JP)

(72) Inventor: Susumu Hatakenaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/963,204

(22) PCT Filed: May 23, 2018

(86) PCT No.: PCT/JP2018/019878
§ 371 (c)(1),
(2) Date: Jul. 17, 2020

(87) PCT Pub. No.: WO2019/224953
PCT Pub. Date: Nov. 28, 2019

(65) Prior Publication Data
US 2021/0125824 A1  Apr. 29, 2021

(51) Int. Cl.
*H01L 21/00* (2006.01)
*H01L 21/02* (2006.01)

(52) U.S. Cl.
CPC .. *H01L 21/02293* (2013.01); *H01L 21/02378* (2013.01); *H01L 21/02447* (2013.01); *H01L 21/02529* (2013.01)

(58) Field of Classification Search
None
See application file for complete search history.

(56) References Cited

U.S. PATENT DOCUMENTS

2015/0295049 A1* 10/2015 Kang ............... H01L 21/02529
  257/77
2015/0380243 A1* 12/2015 Kawada ........... H01L 21/02378
  257/77

FOREIGN PATENT DOCUMENTS

JP  2007-284298 A  11/2007
JP  2013-239606 A  11/2013

OTHER PUBLICATIONS

International Search Report; Written Opinion; and Notification of Transmittal of the International Search Report and the Written Opinion of the International Searching Authority, or the Declaration issued in PCT/JP2018/019878; dated May 23, 2018.

* cited by examiner

Primary Examiner — Reema Patel
(74) Attorney, Agent, or Firm — Studebaker & Brackett PC

(57) ABSTRACT

A SiC varied-growth-rate layer (2) is formed on a SiC bulk substrate (1) while increasing a growth speed from an initial growth speed of 2.0 μm/h or less. A speed change rate of the SiC varied-growth-rate layer (2) is 720 μm/h$^2$ or less. A molar flow ratio of nitrogen to carbon when growth of the SiC varied-growth-rate layer (2) starts is 2.4 or less.

5 Claims, 4 Drawing Sheets

METHOD FOR MANUFACTURING SIC EPITAXIAL SUBSTRATE

FIELD

The present disclosure relates to a method for manufacturing a SiC epitaxial substrate.

BACKGROUND

SiC has excellent physical properties such as dielectric breakdown electric field strength approximately 10 times as high as and a bandgap approximately 3 times as wide as Si. For this reason, in recent years, SiC attracts attention mainly as a power device material for power control. Power devices using SiC can help drastically reducing power losses and device sizes, and realizing power saving at the time of source power conversion. For this reason, SiC power devices will be key devices for realizing a low carbon society such as for high performance electric cars and highly functional solar battery systems. Since active layers of SiC power devices are required to achieve highly accurate doping density and thickness control, the active layers are epitaxially grown on 4H-SiC bulk single crystal using CVD (Chemical Vapor Deposition) or the like.

One of factors that lower the yield of a SiC power device is a triangular defect that may occur during epitaxial growth. In recent years, the need for improvement of the yield by reducing a density of triangular defect has been increasing. For this reason, there has been disclosed a method for causing a varied-growth-rate layer to epitaxially grow in which epitaxial growth at a low growth speed is followed by epitaxial growth at an increased growth speed (e.g., see PTL 1).

CITATION LIST

Patent Literature

[PTL 1] JP 2013-239606 A

SUMMARY

Technical Problem

According to the prior art, a varied-growth-rate layer having a thickness of less than 30 nm is epitaxially grown at a growth speed change rate of 2500 $\mu$m/h$^2$ or more. Therefore, since the amount of raw material supplied is rapidly increased in a growth time of 10 seconds or less, controllability of the supply ratio among respective material gases that affects surface flatness is unsatisfactory, and it has been difficult to stably produce a SiC epitaxial substrate with a flat surface.

An object of the present invention, which has been made to solve the above-described problem, is to provide a method capable of stably producing a SiC epitaxial substrate having a low triangular defect density and excellent surface flatness.

Solution to Problem

A method for manufacturing a SiC epitaxial substrate according to the present disclosure includes: forming a SiC varied-growth-rate layer on a SiC bulk substrate while increasing a growth speed from an initial growth speed of 2.0 $\mu$m/h or less, wherein a speed change rate of the SiC varied-growth-rate layer is 720 $\mu$m/h$^2$ or less, and a molar flow ratio of nitrogen to carbon when growth of the SiC varied-growth-rate layer starts is 2.4 or less.

Advantageous Effects of Invention

In the present disclosure, the initial growth speed of the SiC varied-growth-rate layer is 2.0 $\mu$m/h or less, the speed change rate of the SiC varied-growth-rate layer is 720 $\mu$m/h$^2$ or less, and the molar flow ratio of nitrogen to carbon when growth of the SiC varied-growth-rate layer starts is 2.4 or less. Thus, a SiC epitaxial substrate having a lower triangular defect density and better surface flatness can be stably manufactured.

DESCRIPTION OF EMBODIMENTS

A method for manufacturing a SiC epitaxial substrate according to the embodiments of the present disclosure will be described with reference to the drawings. The same components will be denoted by the same symbols, and the repeated description thereof may be omitted.

First Embodiment

Figure 1:
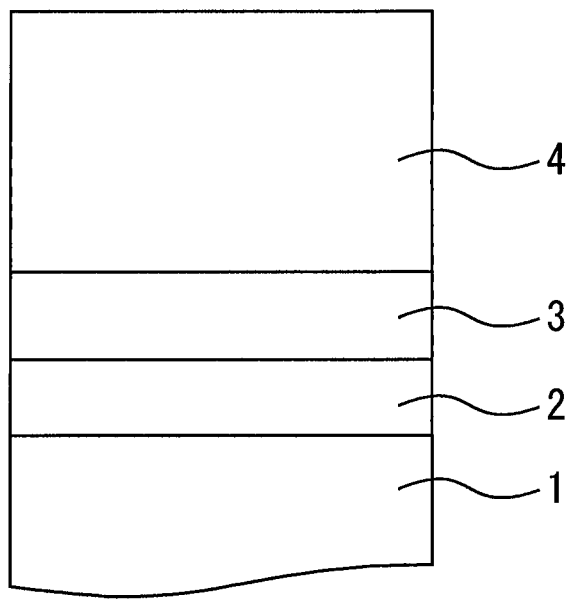
FIG. 1 is a cross-sectional view illustrating a SiC epitaxial substrate according to a first embodiment.

FIG. 1 is a cross-sectional view illustrating a SiC epitaxial substrate according to a first embodiment. A SiC varied-growth-rate layer 2, a SiC buffer layer 3 and a SiC drift layer 4 are laminated in order on a SiC bulk substrate 1.

Figure 2:
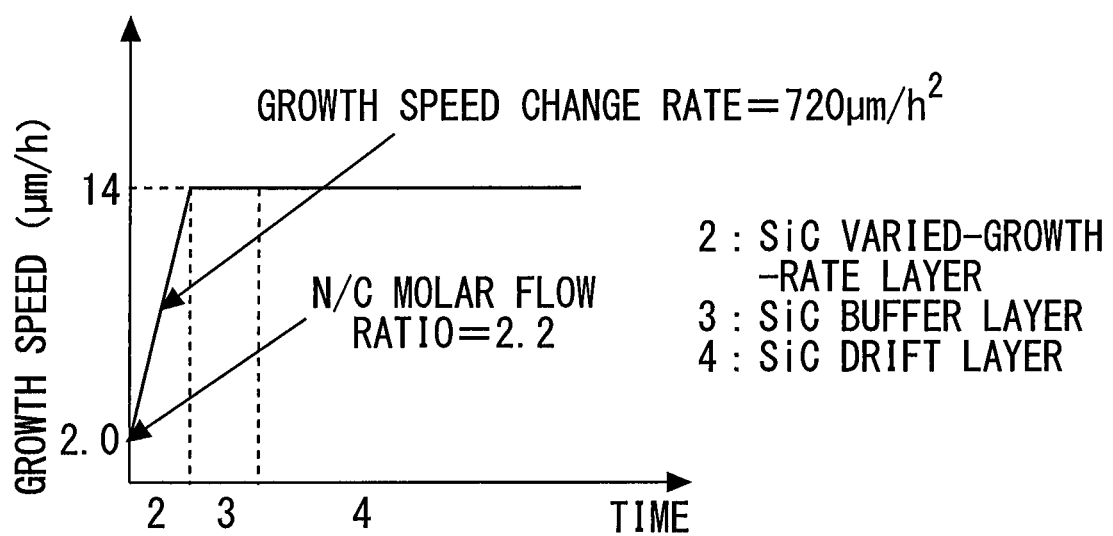
FIG. 2 is a graph schematically illustrating a time variation of growth speed in a SiC epitaxial growth process according to the first embodiment.

Next, a method for manufacturing a SiC epitaxial substrate according to the present embodiment will be described. FIG. 2 is a graph schematically illustrating a time variation of growth speed in a SiC epitaxial growth process according to the first embodiment. CVD is used as a crystal growth method. Here, SiH$_4$ (mono-silane) is used as a silicon raw material and C$_3$H$_8$ (propane) is used as a carbon raw material. However, SiH$_2$Cl$_2$ (dichloro silane) or SiHCl$_3$ (trichloro silane) may be used as the silicon raw material and CH$_4$ (methane) or C$_2$H$_4$ (ethylene) may be used as the carbon raw material. In addition to these material gases, reducing gas such as HCl (hydrogen chloride) or a dopant gas such as N$_2$ (nitrogen) may also be supplied.

First, as the SiC bulk substrate 1, a 4H-SiC bulk single crystal substrate having a 4° off-angle in a <11-20> direction with respect to a (0001) plane (C plane), which serves as a principal plane, is prepared. Here, the off-angle is not limited to 4°, but it is alright if the off-angle falls within a range of 2° to 10°. More specifically, the SiC bulk substrate 1 is subjected to a flattening process by mechanical polishing and chemical mechanical polishing using chemicals exhibiting acidic or alkaline properties. Furthermore, organic matter is removed by applying ultrasound cleaning thereto using acetone. Next, so-called RCA cleaning is applied to the SiC bulk substrate 1. That is, the SiC bulk substrate 1 is immersed for 10 minutes in a mixed solution (1:9) of ammonia water and hydrogen peroxide water heated to 75° C.±5° C., and then immersed in a mixed solution (1:9) of hydrochloric acid and hydrogen peroxide water heated to 75° C.±5° C. Moreover, the SiC bulk substrate 1 is immersed in an aqueous solution containing approximately 5% hydrofluoric acid by volume, further subjected to a substitution process with pure water and the SiC bulk substrate 1 is thereby subjected to surface cleaning.

Next, the SiC bulk substrate 1 is introduced to a CVD apparatus. The interior of the CVD apparatus is vacuumed to approximately 10 kPa. After that, the SiC bulk substrate 1 is heated to approximately 1400° C. to 1700° C., and subjected to an annealing process in a reducing gas atmosphere. Next, a $SiH_4$ gas, a $C_3H_8$ gas and an $N_2$ gas are supplied into the CVD apparatus at flow rates of 25 sccm, 9.0 sccm and 30 sccm respectively, and epitaxial growth of the SiC varied-growth-rate layer 2 is started on the SiC bulk substrate 1 at an initial growth speed of 2.0 μm/h, and with an N/C molar flow ratio of 2.2. In one minute immediately after the start, the flow rates of the $SiH_4$ gas, the $C_3H_8$ gas and the $N_2$ gas are linearly increased up to 200 sccm, 72 sccm, and 1000 sccm respectively. Thus, the SiC varied-growth-rate layer 2 having a thickness of 0.13 μm is caused to epitaxially grow while increasing the growth speed from the initial growth speed. The growth speed change rate at this time is (14 [μm/h]−2 [μm/h])/(1/60[h])=720 μm/h². However, if the growth speed change rate is 720 μm/h² or less, the growth speed may be changed in any way, such as linearly, exponentially or logarithmically. The N/C molar flow ratio may be changed in any way during growth of the SiC varied-growth-rate layer 2. After that, the SiC buffer layer 3 having a thickness of 2 μm and the SiC drift layer 4 having a thickness of 10 μm are caused to grow in order at a growth speed of 14 μm/h. In this case, the $N_2$ gas is supplied such that carrier concentrations of the SiC buffer layer 3 and the SiC drift layer 4 reach $2×10^{18}$ cm³ and $8×10^{15}$ cm$^{-3}$ respectively. After that, the material gas supply is stopped and the temperature is made to fall down to a room temperature.

Setting the initial growth speed to a low growth speed of 2.0 μm/h or less facilitates step-flow growth simultaneously with suppression of two-dimensional nucleation due to excessive raw material of Si or C in an initial stage of growth. Furthermore, setting the N/C molar flow ratio to 2.4 or less in an initial stage of growth facilitates step-flow growth simultaneously with suppression of two-dimensional nucleation due to excessive N, which is a dopant. Setting the growth speed change rate to 720 μm/h² or less makes it possible to control flow rates of the $SiH_4$ gas, the $C_3H_8$ gas and the $N_2$ gas with excellent reproducibility. It is thereby possible to control the raw material supply ratio such as a C/Si ratio that affects surface flatness to a desired value even during a growth speed change.

Figure 3:
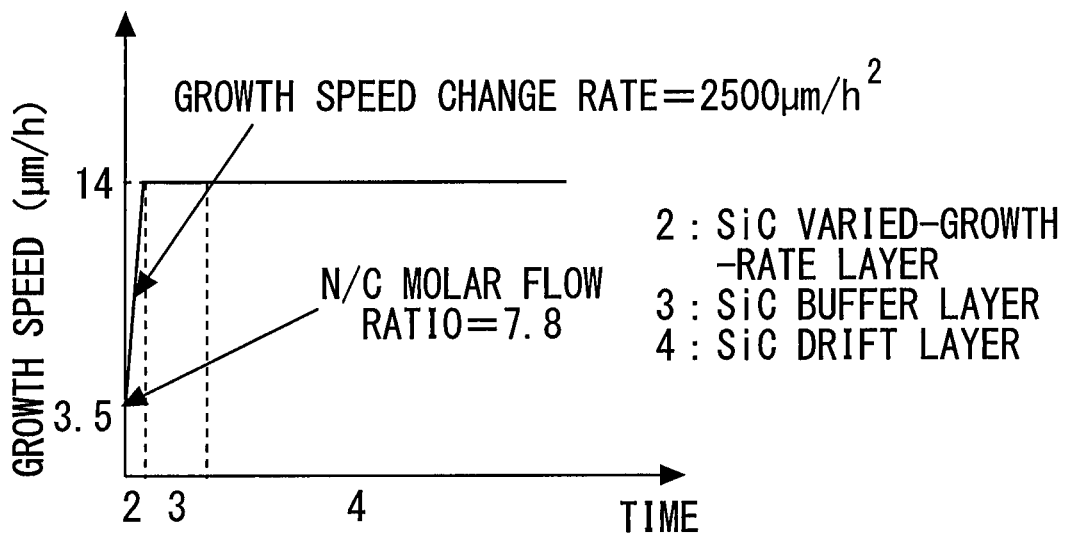
FIG. 3 is a graph schematically illustrating a time variation of the growth speed in a SiC epitaxial growth process according to comparative example 1.

Next, effects of the present embodiment will be described in comparison with comparative examples 1 to 3. FIG. 3 is a graph schematically illustrating a time variation of the growth speed in a SiC epitaxial growth process according to comparative example 1. In comparative example 1, the initial growth speed of the SiC varied-growth-rate layer 2 is 3.5 μm/h, the speed change rate is 2500 μm/h², and the N/C molar flow ratio is 7.8.

Figure 4:
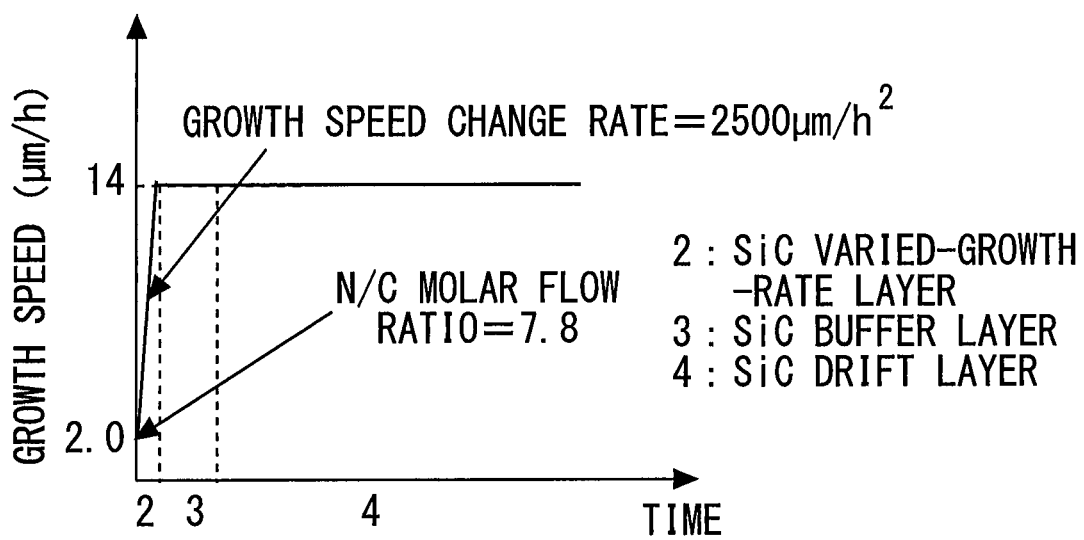
FIG. 4 is a graph schematically illustrating a time variation of the growth speed in a SiC epitaxial growth process according to comparative example 2.

FIG. 4 is a graph schematically illustrating a time variation of the growth speed in a SiC epitaxial growth process according to comparative example 2. In comparative example 2, the initial growth speed of the SiC varied-growth-rate layer 2 is 2.0 μm/h, the speed change rate is 2500 μm/h², and the N/C molar flow ratio is 7.8. Compared to comparative example 1, comparative example 2 has lower initial growth speed, a lower triangular defect density and better surface flatness.

Figure 5:
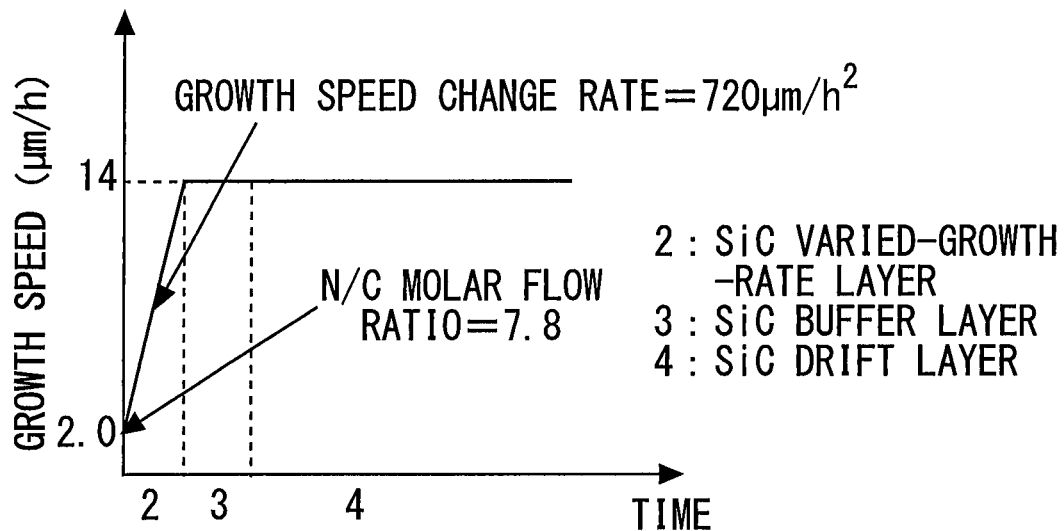
FIG. 5 is a graph schematically illustrating a time variation of the growth speed in a SiC epitaxial growth process according to comparative example 3.

FIG. 5 is a graph schematically illustrating a time variation of the growth speed in a SiC epitaxial growth process according to comparative example 3. In comparative example 3, the initial growth speed of the SiC varied-growth-rate layer 2 is 2.0 μm/h, the speed change rate is 720 μm/h², and the N/C molar flow ratio is 7.8. Compared to comparative example 2, comparative example 3 has a lower speed change rate, furthermore a lower triangular defect density and better surface flatness.

In the first embodiment, the initial growth speed of the SiC varied-growth-rate layer 2 is 2.0 μm/h, the speed change rate is 720 μm/h² and the N/C molar flow ratio is 2.4. Compared to comparative example 3, the first embodiment has a smaller N/C molar flow ratio when growth starts, further a lower triangular defect density and better surface flatness.

As shown in Table 1, in the first embodiment, compared to comparative example 1, the triangular defect density is improved from 0.79 to 0.13 defects/cm² and the surface flatness (RMS: root mean square) is improved from 1.4 to 0.75 nm. Therefore, it is observed that the present embodiment can stably produce a SiC epitaxial substrate having a lower triangular defect density and better surface flatness.

TABLE 1

|  | Varied-growth-rate layer | | N/C molar flow ratio when growth starts | Triangular defect density (defects/cm²) | Surface flatness (nm) |
| --- | --- | --- | --- | --- | --- |
|  | Initial growth speed (μm/h) | Speed change rate (μm/h²) | | | |
| Comparative example 1 | 3.5 | 2500 | 7.8 | 0.79 | 1.4 |
| Comparative example 2 | 2.0 | 2500 | 7.8 | 0.38 | 1.0 |
| Comparative example 3 | 2.0 | 720 | 7.8 | 0.25 | 0.71 |
| First embodiment | 2.0 | 720 | 2.3 | 0.13 | 0.75 |

Second Embodiment

Figure 6:
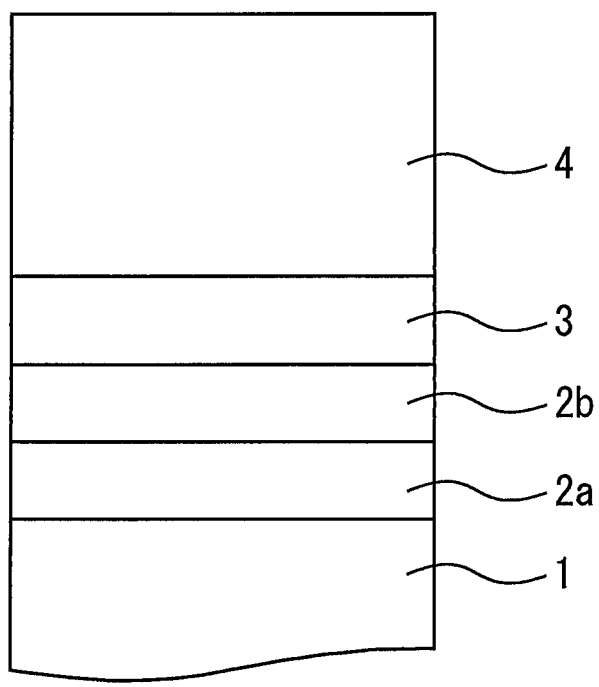
FIG. 6 is a cross-sectional view illustrating a SiC epitaxial substrate according to a second embodiment.

FIG. 6 is a cross-sectional view illustrating a SiC epitaxial substrate according to a second embodiment. First and second SiC varied-growth-rate layers 2a and 2b are provided instead of the SiC varied-growth-rate layer 2 of the first embodiment.

Figure 7:
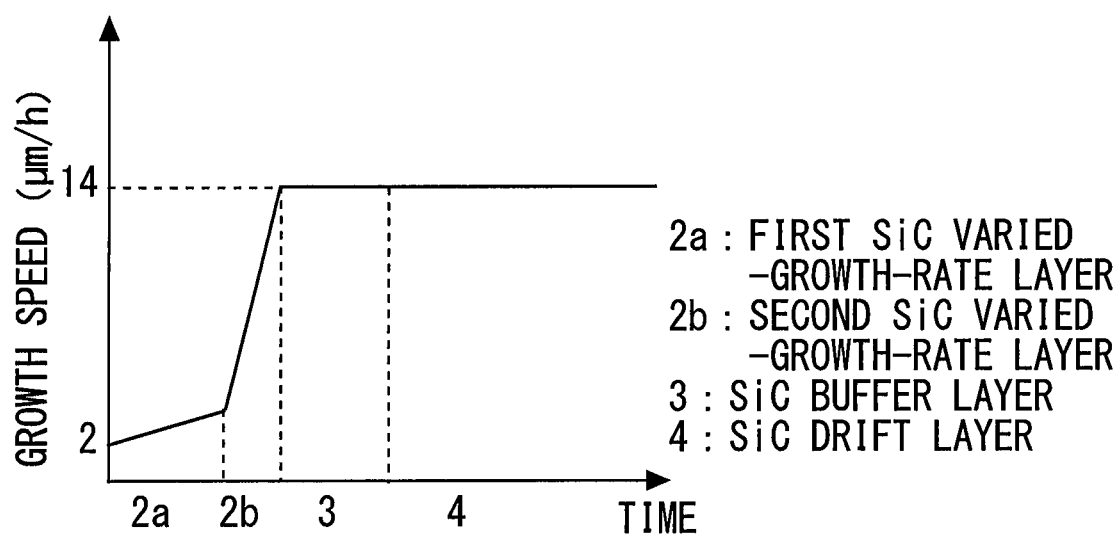
FIG. 7 is a graph schematically illustrating a time variation of the growth speed in a SiC epitaxial growth process according to the second embodiment.

Next, a method for manufacturing a SiC epitaxial substrate according to the present embodiment will be described. FIG. 7 is a graph schematically illustrating a time variation of the growth speed in a SiC epitaxial growth process according to the second embodiment.

First, as in the case of the first embodiment, the SiC bulk substrate 1 is prepared, surface cleaning or the like is performed and the SiC bulk substrate 1 is introduced to the CVD apparatus. The interior of the CVD apparatus is vacuumed to approximately 10 kPa. After that, the SiC bulk substrate 1 is heated to approximately 1400° C. to 1700° C., and subjected to an annealing process in a reducing gas atmosphere. Next, a $SiH_4$ gas, a $C_3H_8$ gas and an $N_2$ gas are supplied at flow rates of 25 sccm, 9.0 sccm and 30 sccm respectively, and epitaxial growth of the first SiC varied-growth-rate layer 2a is started on the SiC bulk substrate 1 at an initial growth speed of 2.0 μm/h, and with an N/C molar flow ratio of 2.2.

In 7 minutes immediately after the start, the flow rates of the $SiH_4$ gas, the $C_3H_8$ gas and the $N_2$ gas are linearly increased up to 43 sccm, 15.5 sccm, and 215 sccm respectively. Thus, the first SiC varied-growth-rate layer 2a having a thickness of 0.29 μm is caused to epitaxially grow while increasing the growth speed from the initial growth speed. The growth speed change rate at this time is (3 [μm/h]−2 [μm/h])/(7/60[h])=8.6 μm/h². After that, while the flow rates of the $SiH_4$ gas, the $C_3H_8$ gas and the $N_2$ gas are linearly increased up to 200 sccm, 72 sccm, and 1000 sccm respectively in one minute, the second SiC varied-growth-rate layer 2b having a thickness of 0.14 m is caused to epitaxially grow. The growth speed change rate at this time is (14 [μm/h]−3 [μm/h])/(1/60[h])=660 μm/h². Although two layers of varied-growth-rate layers are assumed here, there is no limit on the number of layers as long as the growth speed change rate is 720 μm/h² or less. With two layers of varied-growth-rate layers, the growth speed change rate of the first SiC varied-growth-rate layer 2a is to be smaller than the growth speed change rate of the second SiC varied-growth-rate layer 2b, and both rates are to be set to 720 μm/h² or less. The growth speed of these varied-growth-rate layers may be changed in any way such as linearly, exponentially or logarithmically. The N/C molar flow ratio may be changed in any way during growth of the varied-growth-rate layer. The subsequent processes are similar to the processes in the first embodiment.

Next, effects of the present embodiment will be described in comparison with the effects of the first embodiment. In the first embodiment, the initial growth speed of the varied-growth-rate layer 2 is 2.0 μm/h, the speed change rate is 720 μm/h², and the N/C molar flow ratio is 2.4. In the second embodiment, the initial growth speed of the first SiC varied-growth-rate layer 2a is 2.0 μm/h, the speed change rate is 8.6 μm/h², the N/C molar flow ratio is 2.4, and the speed change rate of the second SiC varied-growth-rate layer 2b is 660 μm/h². As shown in Table 2, RMS is improved from 0.75 to 0.50 nm in the second embodiment, providing a further improvement compared to the first embodiment.

TABLE 2

|  | Speed change rate of first SiC varied-growth-rate layer (μm/h²) | Speed change rate of second SiC varied-growth-rate layer (μm/h²) | Surface flatness RMS (nm) |
|---|---|---|---|
| First embodiment | 720 | — | 0.75 |
| Second embodiment | 8.6 | 660 | 0.50 |

REFERENCE SIGNS LIST

1 SiC bulk substrate; 2 SiC varied-growth-rate layer; 2a first SiC varied-growth-rate layer; 2b second SiC varied-growth-rate layer; 3 SiC buffer layer; 4 SiC drift layer

The invention claimed is:

1. A method for manufacturing a SiC epitaxial substrate comprising:
    forming a SiC varied-growth-rate layer on a SiC bulk substrate while increasing a growth speed from an initial growth speed of 2.0 μm/h or less,
    wherein a speed change rate of the SiC varied-growth-rate layer is 720 μm/h² or less, and
    a molar flow ratio of nitrogen to carbon when growth of the SiC varied-growth-rate layer starts is 2.4 or less.

2. A method for manufacturing a SiC epitaxial substrate comprising:
    forming a first SiC varied-growth-rate layer and a second SiC varied-growth-rate layer in order on a SiC bulk substrate while increasing a growth speed from an initial growth speed of 2.0 μm/h or less; and
    forming a SiC buffer layer and a SiC drift layer in order on the second SiC varied-growth-rate layer,
    wherein a growth speed change rate of the second SiC varied-growth-rate layer is larger than a growth speed change rate of the first SiC varied-growth-rate layer.

3. The method for manufacturing a SiC epitaxial substrate according to claim 2, wherein the growth speed change rates of the first and second SiC varied-growth-rate layers are 720 μm/h² or less.

4. The method for manufacturing a SiC epitaxial substrate according to claim 2, wherein a molar flow ratio of nitrogen to carbon when growth of the first SiC varied-growth-rate layer starts is 2.4 or less.

5. The method for manufacturing a SiC epitaxial substrate according to claim 3, wherein a molar flow ratio of nitrogen to carbon when growth of the first SiC varied-growth-rate layer starts is 2.4 or less.

* * * * *